MUTUALLY COMPENSATED TUNED BANDPASS AMPLIFIER CIRCUITRY

Filed April 2, 1963 2 Sheets-Sheet 1

INVENTOR
FRANK J. HOBAN

BY Fisher, Christen, Sabol & Caldwell
ATTORNEYS

MUTUALLY COMPENSATED TUNED BANDPASS AMPLIFIER CIRCUITRY

Filed April 2, 1963 2 Sheets-Sheet 2

INVENTOR
FRANK J. HOBAN
BY Fisher, Christen, Sabol & Caldwell
ATTORNEYS

1

3,505,603

MUTUALLY COMPENSATED TUNED BANDPASS AMPLIFIER CIRCUITRY

Frank J. Hoban, 116 Lafayette St., Muncy, Pa. 17756

Filed Apr. 2, 1963, Ser. No. 269,924
The portion of the term of the patent subsequent to Feb. 7, 1985, has been disclaimed
Int. Cl. H04b 1/68
U.S. Cl. 325—430 10 Claims

ABSTRACT OF THE DISCLOSURE

To obtain a broad, flat bandpass characteristic in an amplifier, the input signal is applied to a pair of tuned circuits which are respectively coupled above and below the critical coupling value, and the output energy from the circuits is combined subject to the arithmetic sum of the bandpass characteristics of the resonant circuits.

The present invention relates in general to radio circuits and, more particularly, to amplifiers incorporating tuned circuitry.

The invention may be considered as an improvement to existing amplifiers or as a new type amplifier in which the frequency response characteristic is flattened to approach constant gain throughout an extended range of frequencies of the input signal. The circuitry is connected in a compensating arrangement such that the heretofore recognized gain reduction with frequency is substantially limited.

The invention has as an important object the combining of the characteristics of separate circuits, each a tuned coupled circuit of itself. The circuits are respectively tuned above and below critical coupling sufficiently to compensate for each other in providing a substantially flat bandpass characteristic. Different portions of the input signal being amplified are supplied to each of the tuned circuits; and subjected to the complementary action thereof, such that upon recombination, a uniformally amplified signal is obtained.

The foregoing principles are readily applicable to radio frequency (RF) or intermediate frequency (IF) stages through the use of RF transformers of the tuned primary and tuned secondary type. Thus, consider now the intermediate frequency stage of a typical receiver employing transformer coupled tuned-plate, tuned-grid IF amplification. It is well known that in such arrangements, a graph of primary or secondary current versus frequency shows a single or double humped response characteristic, depending pimarily upon the value of the coupling coefficient. In both cases the larger coupling coefficients produce the double hump response characteristic and the smaller coupling coefficients provide a single hump response curve.

It is a purpose of this invention to disclose circuitry in various embodiments wherein both types of coupling can be intentionally established in associated circuitry and in a manner to permit a compensating effect such that the peak of the single humped characteristic effectively "fills in" or compensates for the valley in the double humped characteristic to flatten out the overall response characteristic for the stage. In reality the composite characteristic is made up of the arithmetic mean of the single characteristics.

One manner of accomplishing this result is to adjust the coupling of a pair of tuned circuits, such that one coefficient is above the critical value and the other coefficient is below the critical value, thereby insuring the double to single hump compensating relation. By paralleling two plate loads between stages and taking the arith-

2 metic mean to combine their outputs, the flattened response is developed in the plate circuit of the following stage.

Alternatively, the input signal energy may be subject to characteristics of the non-critically coupled circuits with the output of each separately detected and thereafter combined, for example, in an audio frequency stage, to constitute the linerally amplified and detected signal.

With the foregoing in mind, it is an object of this invention to improve the bandpass characteristics of the high frequency of communication or entertainment circuits in general.

It is a further and specific object to improve the frequency response characteristic of tuned-plate, tuned-grid intermediate or radio frequency amplifiers.

A still further object is the provision of a fidelity compensating circuit which is relatively inexpensive and simple in design yet capable of exhibiting a broad flat bandpass frequency response characteristic.

In achieving the foregoing objects it is an objective to avoid the use of added stages of amplification, the cascading of amplifiers, substantial loss in circuit gain or stagger or sideband tuning circuits or techniques.

Other objects, and a more complete understanding of the invention, may be had by reference to the following detailed description, when taken in conjunction with the accompanying drawing in which.

Figure 1:
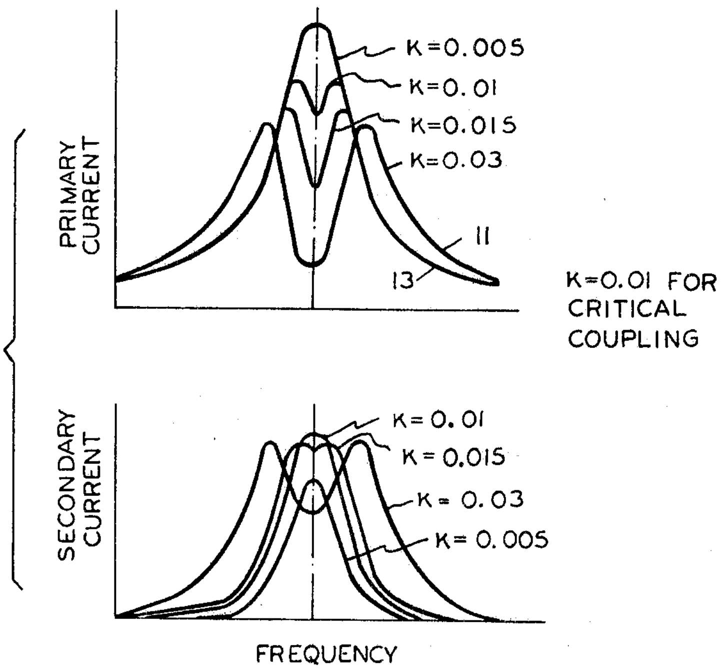
FIG. 1 shows a typical frequency response chart for mutually coupled tuned circuits wherein values of primary and secondary currents are plotted versus frequency.

Reference may now be had to FIG. 1 in which typical characteristic curves are shown depicting the variation of primary and secondary current with frequency for various coefficients of coupling between the primary and secondary of a transformer, for example. The behavior of the circuits coupled together, of course, depends very largely upon the coefficients of coupling $k$. In particular, note that the small coefficient of coupling ($k=0.005$) causes the primary current to appear as a series resonance curve (single hump), whereas the secondary current ($k=0.005$) is consideably smaller than its value under critical coupling conditions. As the coefficient of coupling ($k$) is increased, the curve of primary current becomes broader and the peak value of primary current is reduced.

On the other hand, the secondary current reaches a maximum value and develops a broader top. At critical coupling the primary curve shows double peaks and with still greater coupling the double humps become more prominent and the peaks spread further apart. Critical coupling produces the largest secondary current (without a center dip) or the widest flat bandpass.

For the curves of FIG. 1, critical coupling is 0.01 and it will be noted that the secondary current attains its maximum value and flat width for the curve $k=0.01$.

Figure 2:
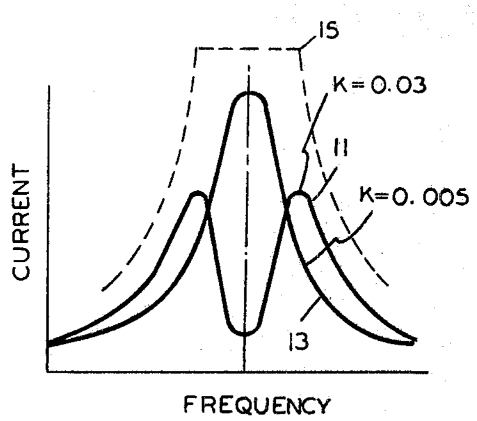
FIG. 2 shows the selection of suitable conditions from the curves of FIG. 1 to provide response characteristics susceptible to arithmetic or summing combination to flatten out a resulting composite frequency bandpass curve.

FIG. 2 is constructed to show the graphic addition of characteristics obtained from a pair of tuned transformer circuits wherein one circuit is tuned to a value above critical coupling ($k=0.03$) as represented by curve 11, and the other is tuned to a value less than critical coupling ($k=0.005$), as represented by curve 13. Graphic or arithmetic addition of the co-ordinate values for the two curves 11 and 13, along vertical lines, provides the curve 15. By way of example, the frequency band covered by the curve 15 may be of the order of, for example, 455–465 kc.

Figures 3, 4, 5:
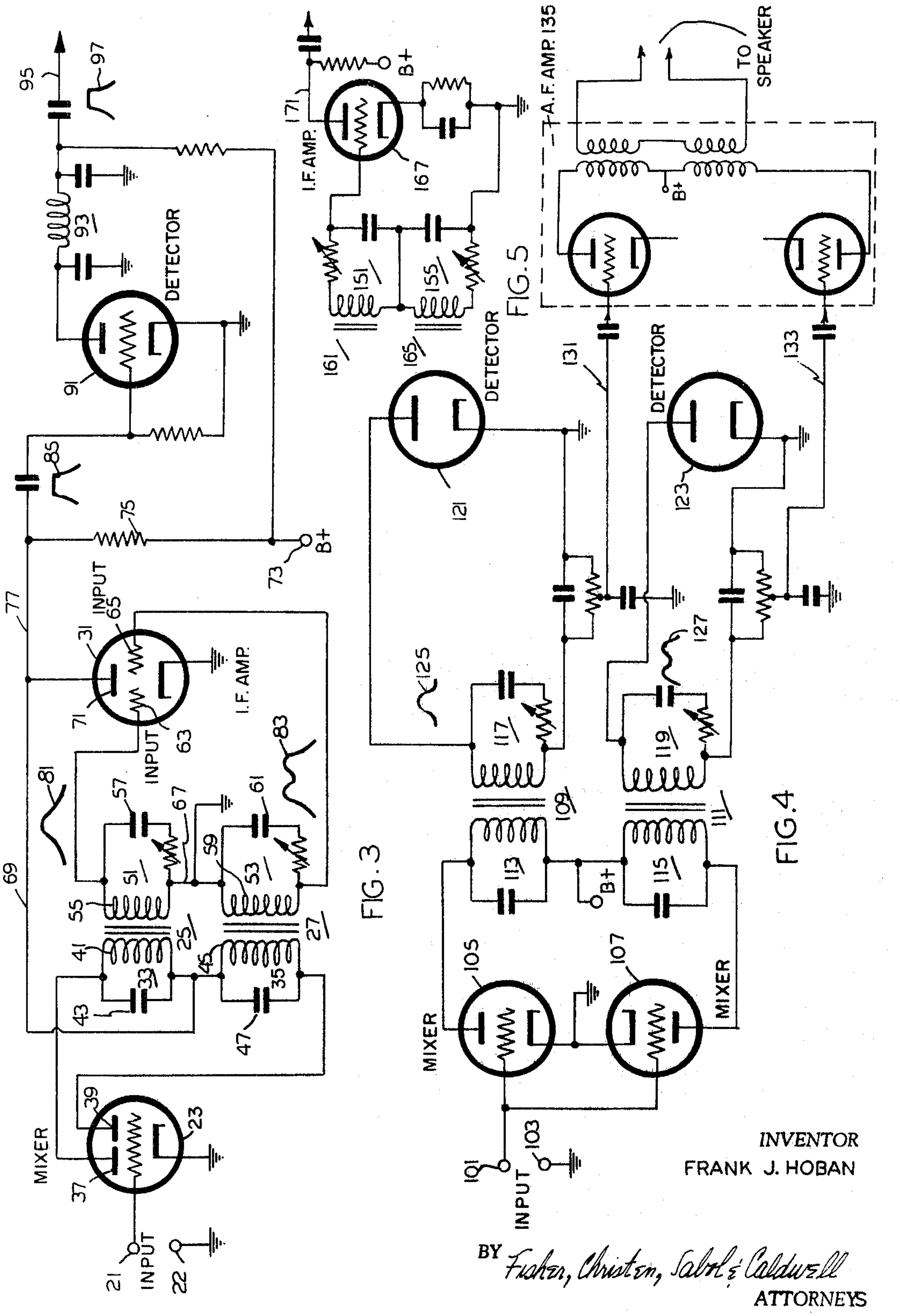
FIG. 3 shows an embodiment of circuitry employing a parallel tuned load, feeding a single tube, connected as an amplifier to provide an IF amplifier characterized by an improved frequency response characteristic.
FIG. 4 shows a circuit diagram capable of serving as mixing and detection stages for a receiver or the like for broadening the response characteristic; and, FIG. 5 is a partial circuit diagram showing an alternative manner of connecting the secondaries of the tuned transformers in additive series relation for recombining the signal energy in, for example, an IF stage.

Turning now to FIG. 3, there is shown a circuit incorporating the principles of the invention as a mixer and IF stage of, for example, a receiver. A pair of input terminals 21 and 22 is provided for the signal wave supplied to a double anode tube 23 connected, for example, as a mixer tube. A pair of tuned primary-tuned secondary transformers 25 and 27 is connected between the mixer tube 23 and the next succeeding stage, including double grid tube 31 connected, for example, as an IF amplifier.

The primary sides 33 and 35 of the transformers 25 and 27 are connected in series between the anodes 37 and 39 of the mixer tube 23. The primary sides of the transformers include, respectively, transformer winding 41 with shunt capacitor 43 connected thereacross and transformer winding 45 with its associated shunt capacitor 47.

The secondary sides 51 and 53 of the transformers are similarly made up, including winding 55 and shunt capacitor 57 and winding 59 with associated shunt capacitor 61.

The secondary sides of the transformers 25 and 27 are connected respectively to control grids 63 and 65 of the IF amplifier tube 31 and are grounded along their common connection 67.

The novel circuit arrangement is completed by lead 69 extending from between the primary sides 33 and 35 to the anode 71 of IF tube 31. The latter tube is supplied B+ from terminal 73 over load resistor 75 and anode lead 77.

The inductances of windings 41, 45, 55 and 59 all are preferably equal in value, as are the capacitances 43, 47, 57 and 61. However, the upper transformer 25 has a coefficient of coupling less than that of critical coupling. For example, it may assume a value of $k=0.005$, corresponding to curve 13 of FIG. 2. The other transformer 27 has a coefficient of coupling greater than the critical value, for example, $k=0.03$, to correspond to curve 11 of FIG. 2.

Thus, the portions of modulated carrier signal wave passing through the transformers 25 and 27 are different by virtue of the different characteristics of the circuits. The signal energy wave form passing through transformer 25 is indicated at 81 (above the secondary side 51) in the form of an RF carrier with audio modulation, whereas the signal wave passing through transformer 27 is indicated at 83 (near the secondary side 53) in the form of a double humped carrier with modulation corresponding to the characteristics exhibited by this circuit.

The signal waves 81 and 83 are combined in the nonlinear IF tube 31 and associated circuitry to provide the flat topped output wave 85, corresponding to the combined frequency response characteristic resulting from the compensating effects of transformers 25 and 27 and circuitry. Signal wave representations, such as 81 and 83 as depicted in the drawing are amplitude versus frequency wave forms. This signal energy may be applied to a detector tube 91 and fed through an RF choke 93 and associated filter network, to appear on output lead 95 as an amplified audio frequency signal, indicated at 97.

The FIG. 3 circuit diagram thus represents the paralleling of two plate loads between stages and utilization of arithmetic mean combining of the characteristics of the double humped curves to effect a flat response in the plate circuit in the following tube. This action may be achieved wherever tuned-primary, tuned-secondary transformers are employed.

FIG. 4 represents a modification in which detection of the separate portions of the amplified, input signal wave is achieved prior to the recombination. In this figure, the input energy is applied at terminals 101 and 103 and is fed to the individual mixer stages, represented by tubes 105 and 107. The tuned-primary, tuned-secondary transformers 109 and 111 (which may be similar to the transformers 25 and 27) have their primary sides 113 and 115 connected as plate loads for the IF tubes 105 and 107 and their secondary sides 117 and 119 connected in circuit with the detector diodes 121 and 123. Thus, the wave form energy, as indicated at 125 and 127, is fed to the detectors for rectification. The outputs from the detectors are applied over leads 131 and 133 to a crystal AF amplifier for recombination in the form of a linearally amplified and detected signal. While the usual IF stage is omitted here, it will be appreciated that an important principle depicted by the FIG. 4 arrangement is the ability of the invention to permit the separated portions of the input energy to pass through one or more various stages prior to recombination.

The FIG. 4 drawing employs separate tubes to indicate, among other purposes, the ease of transistorizing the circuit, tubes 105 and 107 being replaceable by conventional transistors and detector diodes 121 and 123 by semiconductor rectifiers with minimal circuitry design changes.

Thus, it is seen that the separated signal portions are amplified and detected for recombination in a further stage, such as the audio stage or at a speaker, if desired. It should be noted that in the usual case one or more IF stages would be included between the mixer stage and the detector stage; however, the circuit has been simplified by this omission, as well as, by omission of standard components, such as, suppression and screen grids and their voltage supplies, etc.

A further embodiment of the invention is illustrated in FIG. 5, wherein the secondaries 151 and 155 of a pair of transformers 161 and 165, corresponding to the transformers of either of the previous embodiments, are connected in additive series relation in the grid to cathode circuit of, for example, an IF amplifier tube 167.

The circuitry of FIG. 5 avoids the necessity for a primary connection, such as lead 69 of FIG. 3, yet enables exposure of the signal energy to the combined characteristics of the circuits of transformers 161 and 165 to recombine the amplified signal wave in the plate circuit 171 of IF tube 167. Here again, the circuit modification is useful in any stage where the tuned-primary tuned-secondary transformers are useful.

The invention has been set forth with respect to applications to amplification circuitry. It should be mentioned that the principles are also applicable to circuits with other assigned functions. For example, use may be made in bandpass selectivity, isolation networks, limiting, and in general, wherever a flat response type frequency characteristic is useful. Also, simplified circuit versions have been employed by omitting standard components, such as the local oscillator for the mixer stage, extra tube elements and their associated supplies, as well as bias sources and the like.

It should be appreciated that the invention thus discloses several approaches to wide band amplification due to coupling selection. The bandwidth of course, may be broadened by increasing the coupling coefficient and, in general, the higher the coefficient the farther apart the two peaks and thus the greater the bandwidth and noise reduction.

While the invention has been described in connection with certain preferred embodiments thereof, it will, nevertheless, be apparent to those skilled in the art that other and further modifications are possible within the principles herein taught, and accordingly, it is intended that the invention be limited only by the scope of the appended wherein:

What is claimed is:

1. Electrical apparatus comprising, in combination, a pair of tuned circuits each exhibiting mutual coupling characteristics in electrical connection; one of said circuits having a coefficient of coupling below the critical value and the other circuit having a coefficient of coupling above the critical value, means for supplying input signal energy to the circuits; leads connecting the circuits in series across the supplying means; and, means for combining the output energy from the circuits subject to the arithmetic sum of the bandpass characteristics of the resonant circuits; said last mentioned means comprising a double input-single output means connected to receive the output energy from the circuits by way of the double input respectively.

2. The apparatus of claim 1, wherein the pair of tuned circuits consists of a pair of RF tuned-primary, tuned-secondary transformers.

3. The apparatus of claim 1, wherein the means for supplying the input signal energy is a mixer stage and the means for combining the output energy is an IF amplifier stage.

4. The apparatus of claim 1, wherein the tuned circuits each comprise a transformer having tuned-primary, tuned-secondary winding circuits and wherein the secondary windings are connected in additive series relation.

5. A substantially flat bandpass amplifier for a modulated intermediate radio frequency carrier comprising, in combination, an input stage including a pair of tuned loads therefor; each of the loads including a primary tuned circuit and a secondary tuned circuit mutually coupled; one of the loads being characterized by a coefficient of coupling below the critical value and the other load being characterized by a coefficient of coupling above the critical value; a non-linear combining stage connected to receive energy from the secondary circuits of the loads to provide a relatively flat bandpass to the signal energy; said combining stage comprising tube means having at least grid, cathode and anode electrodes and said secondary circuits being connected to supply energy to the grid to cathode electrodes; and, output terminals at said last-mentioned stage for the amplified output energy.

6. The amplifier of claim 5, wherein the first stage comprises a double anode tube connected as a mixer stage and the loads are respectively plate loads; and the stage for combining the energies comprises a double grid tube connected as an IF amplifier stage receiving secondary energy voltage as control grid supplies therefor.

7. A substantially flat bandpass amplifier for intermediate and radio frequency energy comprising, in combination, an input mixer stage including a double anode tube; a pair of tuned-primary, tuned-secondary RF transformers; the primaries of said transformers being connected in series between the anodes of said tube; a tube including at least a grid and cathode connected as an IF amplifier; the secondaries of the transformers being connected in additive series relation in the grid-cathode circuit of said last-mentioned tube, whereby energy passing from the input stage through the IF amplifier is amplified pursuant to the arithmetic combination of the characteristics exhibited by the transformers.

8. A substantially flat band-pass amplifier comprising, in combination, separate amplifying devices connected as intermediate frequency amplifiers; a pair of tuned-primary, tuned-secondary transformers the primaries of said transformers connected as loads for the intermediate frequency amplifiers; detector means; the secondaries of the transformers connected to feed energy to the detector means; and audio frequency amplifier means connected to receive the output of the detector means for recombination in accordance with a summing of the characteristics exhibited by the transformers; said audio means comprising a pair of tubes as having at least a cathode, grid and anode connected in circuit to amplify detected audio energy; connections from the detector means respectively to each grid; and said tuned transformers respectively having coefficients of coupling above and below critical coupling thereby enabling said re-combination.

9. A high fidelity amplifier for input signal energy comprising, in combination, a plurality of tuned circuits mutually coupled in pairs; one pair of said circuits having a coefficient of coupling below the critical value and another pair having a coefficient of coupling above the critical value; means for supplying a portion of the input signal energy to one pair of the circuits and a different portion of the input signal energy to said another pair of the circuits; means for combining the output energies from the circuits subject to the arithmetic mean bandpass characteristics of the circuits; said last mentioned means comprising tube means responsive to the output energies as a function of amplitude versus frequency combination thereof.

10. The amplifier of claim 9, wherein the means for supplying the input signal energy comprises one of a mixer stage and an IF amplifier stage; and the means for combining the output energy comprises one of an IF amplifier stage and audio frequency detection amplifying means.

References Cited

UNITED STATES PATENTS

| | | | |
|---|---|---|---|
| 2,270,539 | 1/1942 | Malling | 330—167 X |
| 2,710,315 | 6/1955 | Tongue | 330—154 X |
| 3,234,480 | 2/1966 | Maeda | 330—31 X |

ROBERT L. GRIFFIN, Primary Examiner

R. S. BELL, Assistant Examiner

U.S. Cl. X.R.

325—383, 489; 33—154, 157